United States Patent
Son

(10) Patent No.: US 10,884,024 B2
(45) Date of Patent: Jan. 5, 2021

(54) TEST SOCKET UNIT

(71) Applicant: LEENO INDUSTRIAL INC., Busan (KR)

(72) Inventor: Jang-youl Son, Changwon-si (KR)

(73) Assignee: LEENO INDUSTRIAL INC.

( * ) Notice: Subject to any disclaimer, the term of this patent is extended or adjusted under 35 U.S.C. 154(b) by 300 days.

(21) Appl. No.: 16/015,488

(22) Filed: Jun. 22, 2018

(65) Prior Publication Data
US 2018/0299484 A1 Oct. 18, 2018

Related U.S. Application Data

(63) Continuation of application No. PCT/KR2017/003292, filed on Mar. 28, 2017.

(30) Foreign Application Priority Data

Mar. 30, 2016 (KR) .................. 10-2016-0038495

(51) Int. Cl.
*G01R 1/04* (2006.01)
*G01R 1/073* (2006.01)

(52) U.S. Cl.
CPC ....... *G01R 1/0466* (2013.01); *G01R 1/07378* (2013.01)

(58) Field of Classification Search
CPC ........ G01R 1/04; G01R 1/045; G01R 1/0408; G01R 1/0466; G01R 1/0433; G01R 1/0425; G01R 1/0475; G01R 1/0483; G01R 1/06; G01R 1/067; G01R 1/06794; G01R 1/073; G01R 1/07378; G01R 1/0441; G01R 31/28; G01R 31/2863; G01R 31/2886
See application file for complete search history.

(56) References Cited

U.S. PATENT DOCUMENTS

| | | | | |
|---|---|---|---|---|
| 4,164,003 | A | * | 8/1979 | Cutchaw ............. H01L 23/4006 257/E23.084 |
| 6,835,072 | B2 | * | 12/2004 | Simons ............. H01R 13/2421 439/66 |
| 2002/0181206 | A1 | * | 12/2002 | Isenburg ............. H01L 23/4093 361/720 |

FOREIGN PATENT DOCUMENTS

| CN | 2932756 Y | 8/2007 |
|---|---|---|
| JP | 2000133398 A | 5/2000 |

(Continued)

OTHER PUBLICATIONS

Korean Notice of Allowance (KR 10-2016-0038495), KIPO, dated Jun. 16, 2017.

(Continued)

*Primary Examiner* — Son T Le
(74) *Attorney, Agent, or Firm* — Park & Associates IP Law, P.C.

(57) ABSTRACT

A test socket unit for electrically connecting a test object and a test circuit device. The test socket unit includes: a plurality of support locking pins configured to be stationarily installed on the surface of the test substrate; a socket main body configured to support a plurality of probes for signal transmission; a floating plate configured to include a pin guide hole in which the support locking pin is inserted; an elastic member configured to be interposed in between the socket main body and the floating plate; and at least one locking member configured to include a locking portion engaged with the locking engaging portion and prevented from separating upward by the locking stopper.

6 Claims, 7 Drawing Sheets

(56) References Cited

FOREIGN PATENT DOCUMENTS

| | | | | | |
|---|---|---|---|---|---|
| JP | 2006-286613 | A | | 10/2006 | |
| JP | 2009-036679 | A | | 2/2009 | |
| JP | 2012119118 | A | * | 6/2012 | ......... H01R 12/7029 |
| KR | 10-1999-0064101 | A | | 7/1999 | |
| KR | 10-2013-0071817 | A | | 7/2013 | |
| KR | 10-2013-0123193 | A | | 11/2013 | |
| TW | M481409 | U | | 7/2014 | |
| TW | 201608244 | A | | 3/2016 | |

OTHER PUBLICATIONS

International Search Report (PCT/KR2017/003292), WIPO, dated Jul. 3, 2017.
Taiwan Notice of Allowance, TIPO, dated Oct. 30, 2017.
Chinese Office Action (CN 201780014097.3), CNIPA, dated Mar. 19, 2020.

\* cited by examiner

TEST SOCKET UNIT

REFERENCE TO RELATED APPLICATIONS

This is a continuation of International Patent Application PCT/KR2017/003292 filed on Mar. 28, 2017, which designates the United States and claims priority of Korean Patent Application No. 10-2016-0038495 filed on Mar. 30, 2016, the entire contents of which are incorporated herein by reference.

FIELD OF THE INVENTION

The present invention relates to a test socket unit for electrically connecting a test object and a test circuit device.

BACKGROUND OF THE INVENTION

A test socket for testing a semiconductor chip is used for electrically connecting a terminal of the semiconductor chip and a contact point (pad) on a substrate of a test circuit device for applying a test signal. Such a test socket includes a built-in test probe for electric connection between the terminal of the semiconductor chip and the contact point on the substrate of the test circuit device. To stably carry out the test, the test socket is coupled to the substrate of the test circuit device by a screw or the like fastening method.

Occasionally, the test socket coupled by such a fastening method may be required to be separated from the substrate because of maintenance or the like reasons. However, it is very inconvenient to loosen the fastening screw, separate the test socket from the substrate, and couple a new or existing test socket to the substrate with the fastening screw.

SUMMARY OF THE INVENTION

One or more exemplary embodiments are to provide a test socket unit, by which a test socket is more easily locked to and unlocked from a substrate of a test circuit device.

According to an aspect of an exemplary embodiment, there is provided a test socket unit to be locked to a test substrate of a test circuit device, the test socket unit including: a plurality of support locking pins configured to be stationarily installed on the surface of the test substrate, protrude upward from the surface of the test substrate, and include a locking engaging portion and a locking stopper at an end portion along a protruding direction; a socket main body configured to support a plurality of probes for signal transmission and include a pin through hole through which the support locking pin passes; a floating plate configured to include a pin guide hole in which the support locking pin is inserted, and be coupled to a top surface of the socket main body while being floated at a predetermined height from the socket main body; an elastic member configured to be interposed in between the socket main body and the floating plate; and at least one locking member configured to include a locking portion engaged with the locking engaging portion and prevented from separating upward by the locking stopper, be coupled to the floating plate, and be movable so that the locking portion can be locked to and unlocked from the locking engaging portion in a state that the floating plate is elastically pressed against the socket main body.

The locking stopper may include a holding projection more extended in a direction transverse to the protruding direction than the locking engaging portion, the locking member may be supported on the floating plate and slides along a surface of the floating plate, and the locking portion may be locked to and unlocked from the locking engaging portion along the surface of the floating plate.

The support locking pin may include a groove formed in the protruding direction and be elastically transformable in a direction transverse to the protruding direction while being locked to and unlocked from the locking portion.

The at least one locking member may include a pair of locking members arranged to face each other at opposite sides of the floating plate.

The locking member and the floating plate may be engaged with each other to allow the locking member to slide.

The any one of the locking member and the floating plate may include a sliding slot, and other one of the locking member and the floating plate may include a guide pin inserted into the sliding slot.

According to the present invention, test socket may be more easily locked to and unlocked from a substrate of a test circuit device.

DETAILED DESCRIPTION OF THE INVENTION

Below, exemplary embodiments will be described in detail with reference to accompanying drawings.

Figure 1:
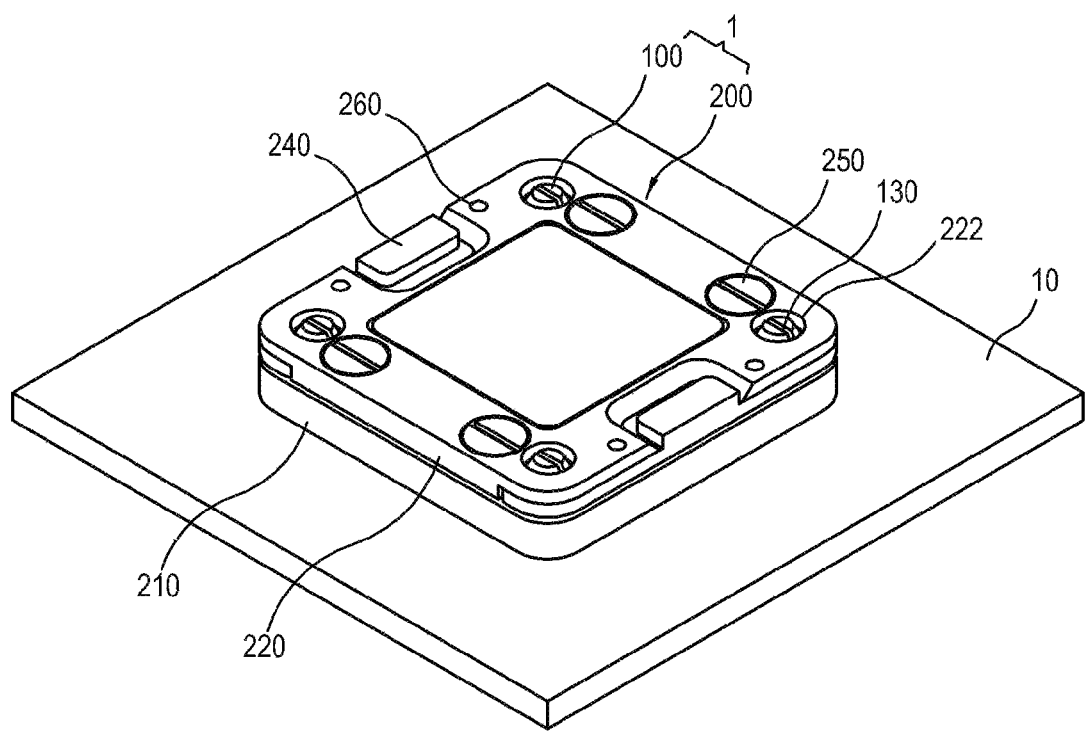
FIG. 1 is a perspective view of a test socket unit according to an exemplary embodiment.
Figure 2:
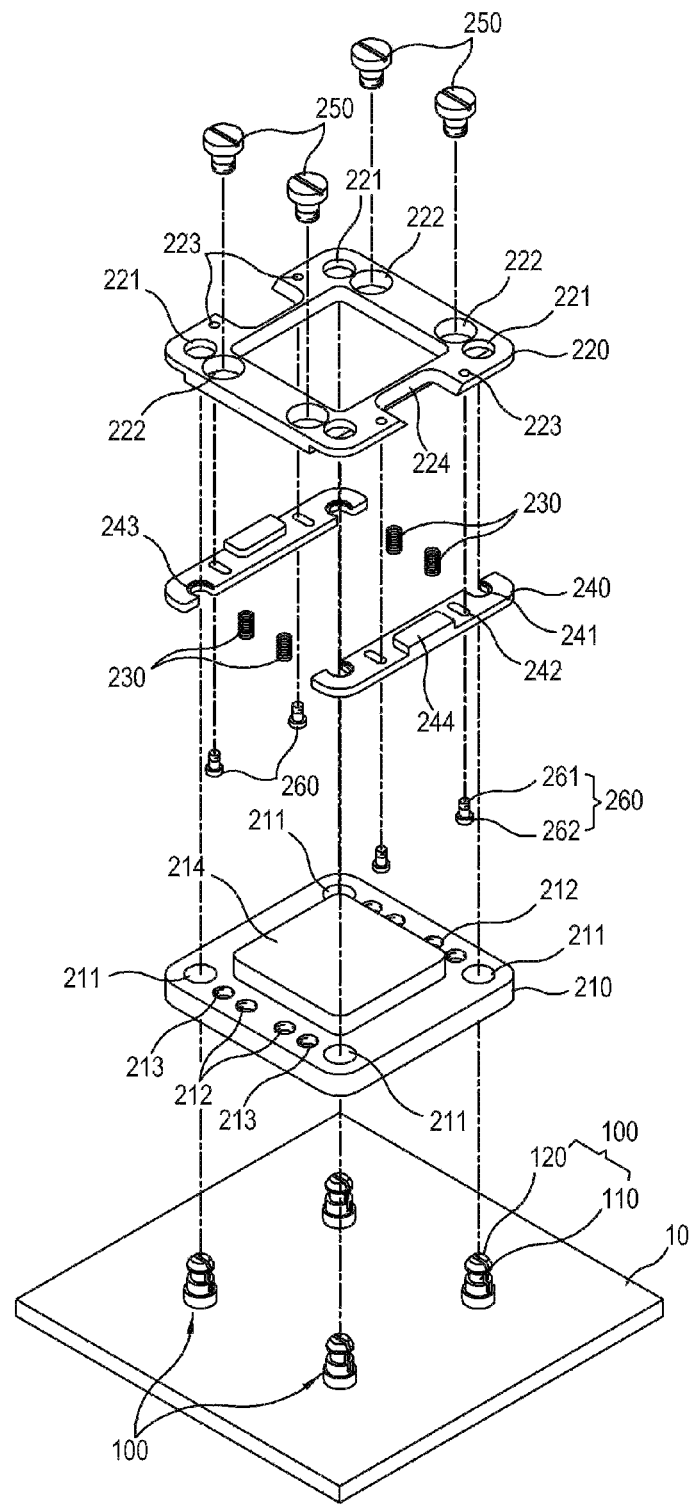
FIG. 2 is an exploded perspective view of the test socket unit according to an exemplary embodiment.

FIG. 1 is a perspective view of a test socket unit according to an exemplary embodiment, and FIG. 2 is an exploded perspective view of the test socket unit according to an exemplary embodiment. The test socket unit 1 includes a substrate 10 and a test socket 200. The test socket 200 includes a socket main body 210, a floating plate 220, an elastic member 230, and a locking member 240. The test socket 200 electrically connects a contact point (not shown) to be tested in the test object and a contact point (not shown) formed on the substrate 10 of the test circuit device. In the test socket unit 1 according to an exemplary embodiment, the test socket 200 is locked to the test circuit device by coupling with a support locking pin 100 stationarily installed on the substrate 10.

The substrate 10 transmits an electric test signal, power, etc. from the test circuit device (not shown) to the test object (not shown) through the test socket 200. The substrate 10 receives an electric signal from the test object through the test socket 200. The substrate 10 includes a plurality of pads (not shown) to come into contact with first ends of the probes (not shown) of the test socket 200. The substrate 10 includes a plurality of support locking pins 100 protruding upward from the surface thereof and coupling with the socket 200.

The support locking pin 100 includes a locking engaging portion 110 and a locking stopper 120 which are formed along a protruding direction. The locking stopper 120 includes a holding projection 140 more extended in a direction transverse to the protruding direction than the locking engaging portion 110. For example, the holding projection 140 may be formed by making the locking engaging portion 110 step back from the locking stopper 120. The support locking pin 100 is branched into two along the protruding direction by a groove 130. The groove 130 is elastically transformable in a direction transverse to the protruding direction. Referring to FIGS. 1 and 2, the support locking pin 100 is branched into two by one groove 130, but not limited thereto. Alternatively, the support locking pin 100 may be branched into three or more. The support locking pin 100 is locked to the locking member 240 of the test socket 200 to be described later so that the substrate 10 and the test socket 200 can couple with each other.

The test socket 200 includes the socket main body 210, the floating plate 220, the elastic member 230, the locking member 240, a fastening member 250, and a guide pin 260. The test socket 200 includes a plurality of probes (not shown) supported inside the socket main body 210 in order to electrically connect the test object and the substrate 10.

The socket main body 210 is shaped like a rectangular plate having a probe supporter 214 like an island at the center thereof. The probe supporter 214 supports the plurality of probes (not shown) although they are not illustrated in FIG. 2. The socket main body 210 includes a pin through hole 211 positioned outside the probe supporter 214 and allowing the support locking pin 100 to pass, an elastic member accommodating groove 212 for receiving a first end of the elastic member 230, and a fastening member coupling hole 213 for coupling with the fastening member 250.

The pin through hole 211 is formed at each outward corner portion of the socket main body 210 in order to be penetrated by the support locking pin 100. The number of pin through holes 211 is provided as many as the number of support locking pins 100.

The elastic member accommodating groove 212 is formed on the top surface of the socket main body 210 and opened upward to receive one side of the elastic member 230. Thus, the first end of the elastic member 230 is in contact with and supported on the bottom of the elastic member accommodating groove 212. A second end of the elastic member 230 is inserted in an elastic member accommodating groove (not shown) formed on a bottom surface of the floating plate 220.

With the fastening member coupling hole 213 coupled to, the fastening member 250 makes the floating plate 220 be coupled to the socket main body 210 as it is being floated. For example, the fastening member 250 may be achieved by a screw or the like structure that has a head larger than the coupling hole 213, a body passing through the coupling hole 213, and a thread formed on an end portion of the body. The floating plate 220 is shaped like a rectangular plate, the center of which is opened. The opened center of the floating plate 220 accommodates the rectangular probe supporter 214 of the socket main body 210. The floating plate 220 includes a pin guide hole 221 in which the support locking pin 100 is inserted, a fastening member through hole 222 through which the fastening member 250 passes, a guide pin coupling hole 223 to which the guide pin 260 is coupled, and a cut portion 224 for accommodating a control projection 244 of the locking member 240.

The pin guide hole 221 is formed at each corner portion of the floating plate 220 and receives an end portion of the support locking pin 100. The number of pin guide holes 221 corresponds to the number of support locking pins 110.

The fastening member through hole 222 accommodates the body of the fastening member 250 for coupling the socket main body 210 and the floating plate 220.

The guide pin coupling hole 223 couples with a first end of the guide pin 260 to be described later. The guide pin coupling hole 223 may be internally formed with a thread. The guide pin 260 is coupled to the guide pin coupling hole 223 of the floating plate 220 as it is inserted in a sliding slot 242 of the locking member 240 to be described later.

The elastic member 230 is interposed in between the elastic member accommodating groove 212 of the socket main body 210 and the elastic member accommodating groove (not shown) of the floating plate 220. The elastic member 230 may be achieved by an elastic spring. Alternatively, the elastic member 230 may be achieved by any elastic material without limitation.

The cut portion 224 is recessed inward along the outer circumference of the floating plate 220. The cut portion 224 accommodates the control projection 244 of the locking member 240 when the test socket 200 is locked to the support locking pin 100.

The locking member 240 includes a locking portion 241, the sliding slot 242, and the control projection 244. The locking member 240 is interposed in between the floating plate 220 and the socket main body 210 and coupled to the support locking pin 100. The locking member 240 forms a pair, and the pair of locking members 240 may be arranged to face with each other at opposite sides of the floating plate 220. The control projection 244 is accommodated in the cut portion 224 of the floating plate 220 when the test socket 200 is locked to and unlocked from the support locking pin 100.

The locking portion 241 has a semicircular shape partially opened to be engaged with the locking engaging portion 110 of the support locking pin 100. The locking portion 241 includes an engaging surface 245 (see FIG. 4) to be engaged with the locking engaging portion 110, a contact surface 246 to be in contact with the holding projection 140 (see FIG. 5) of the support locking pin 100, a stop surface 247 to be engaged with the locking stopper 120, and a separation preventing portion 243 to prevent the locking member 240 from separation. The shape of the locking portion 241 is not limited to the semicircular shape, and may be varied depending on the shape of the locking engaging portion 110.

The sliding slot 242 is formed by penetrating the locking member 240 like an elliptical hole elongated in a moving direction of the guide pin 260 so that the guide pin 260 can move along the surface of the plate.

The fastening member 250 passes through the fastening member through hole 222 and coupled with the fastening member coupling hole 213 of the socket main body 210. The fastening member 250 makes the floating plate 220 be fastened to the socket main body 210 as the floating plate 220 is being floated. The fastening member 250 allows the floating plate 220 to move up and down by upward elasticity within a predetermined limited upper range.

The guide pin 260 passes through the elongated hole of the sliding slot 242 and couples with the guide pin coupling hole 223 of the floating plate 220. The guide pin 260 has a head that cannot pass through the sliding slot 242, a body that can pass through the sliding slot 242, and an end portion formed in the body and fastened to the guide pin coupling hole 223. The guide pin 260 makes the locking member 240 come into close contact with the floating plate 220 and be movable along the elongated hole of the sliding slot 242. Referring to FIG. 1 and FIG. 2, the guide pin 260 is installed to pass the sliding slot 242 formed in the locking member 240, but not limited thereto. Alternatively, a sliding slot may be formed in the floating plate 220 and the guide pin may be coupled to the locking member 240.

Referring to FIG. 1 and FIG. 2, the test socket 200 is installed to be elastically pressed downward by the elastic member 230 and the fastening member 250 interposed in between the socket main body 210 and the floating plate 220. That is, the floating plate 220 is elastically urged upward when it couples with the socket main body 210. Such elastic upward-movement of the floating plate 220 is restricted by the fastening member 250, but the floating plate 220 may be pressed downward to move downward within a predetermined downward limited range. Therefore, the socket main body 210 and the floating plate 220 are coupled leaving a predetermined space therebetween so that the floating plate 220 can move downward within a predetermined range.

In the test socket unit 1 according to an exemplary embodiment, the test socket 200 can be easily coupled to and separated from the substrate. Below, the locking and unlocking operations between the test socket 200 and the support locking pin 100 according to the present invention will be described with reference to FIGS. 3 to 9.

First, the locking operations are roughly divided into three steps. The first step is to press the floating plate 220 downward. The second step is to insert a pair of locking members 240 in the floating plate 220 along the sliding slot 242 thereof in a direction of the surface of the floating plate 220 in the state that the floating plate 220 is pressed downward. The third step is to release the floating plate 220 from the downward pressure. If the floating plate 220 is released from the downward pressure, the support locking pin 100 and the test socket 200 are locked to each other.

Figure 3A:
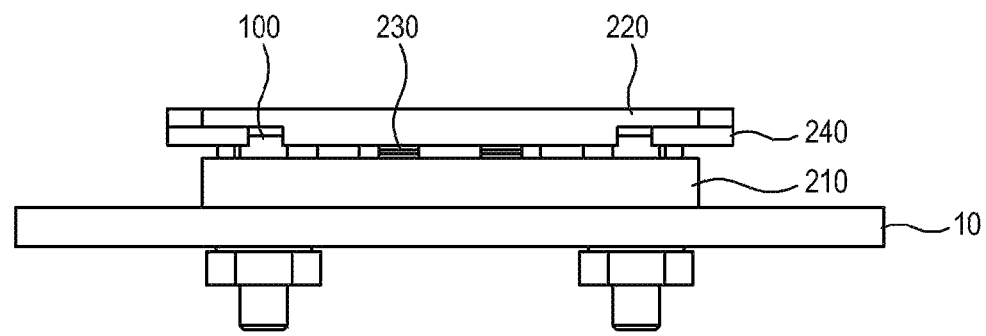
FIGS. 3A to 3C are views for explaining operations of the test socket unit according to an exemplary embodiment.
Figure 3B:
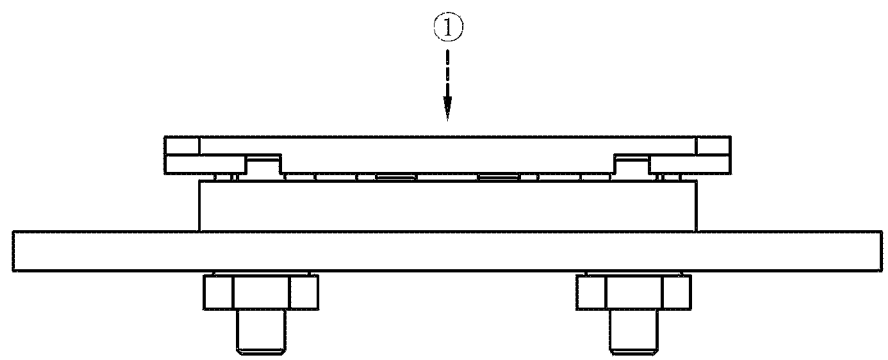
Figure 3C:
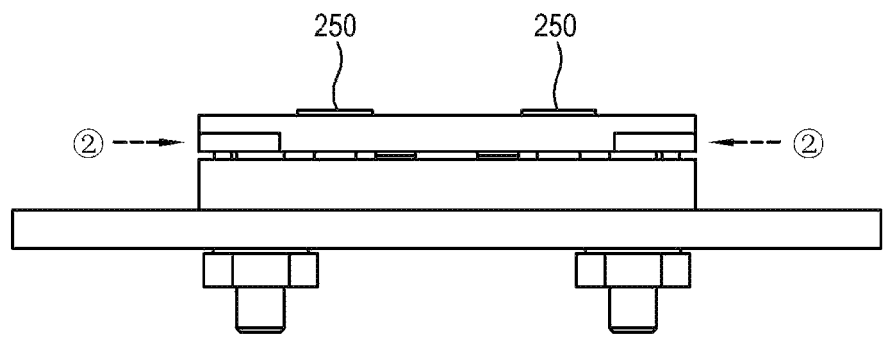
Figure 4:
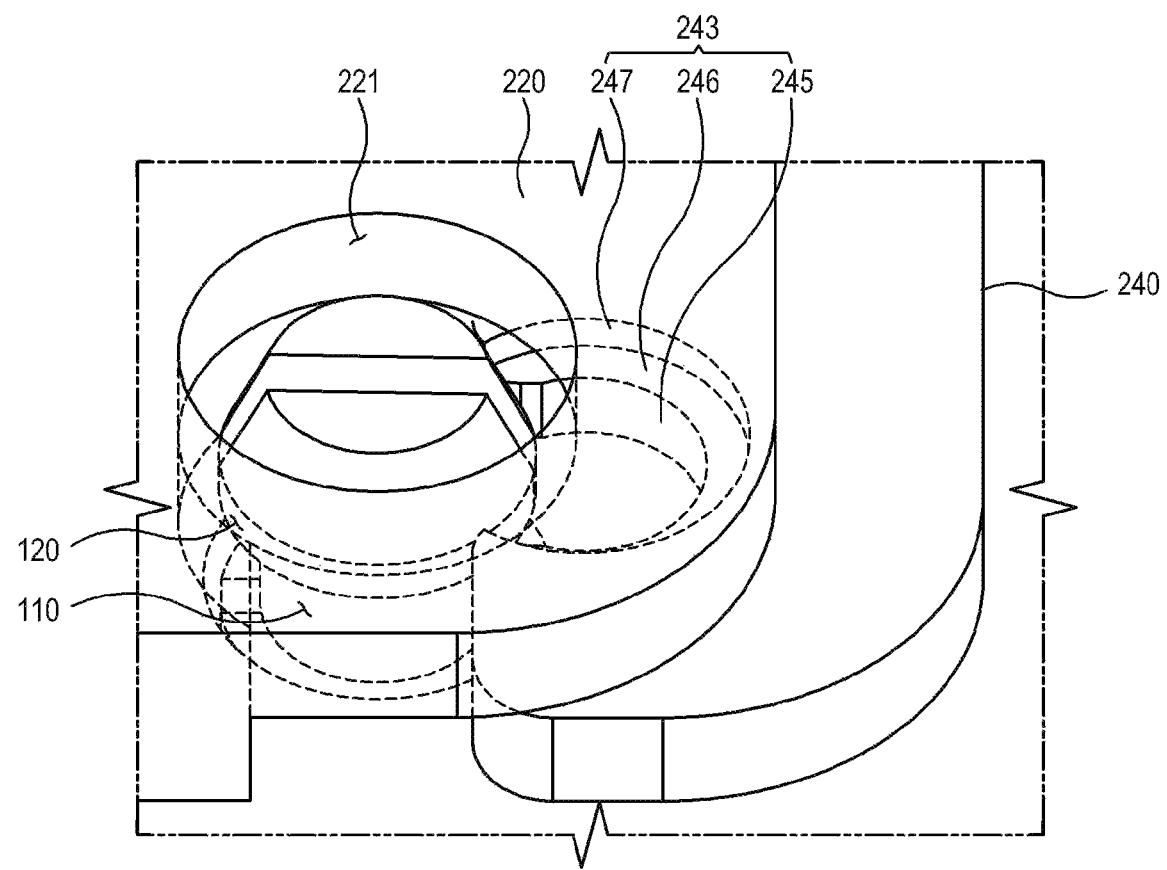
FIG. 4 is a partial perspective view of the test socket unit according to an exemplary embodiment before locking.
Figure 7:
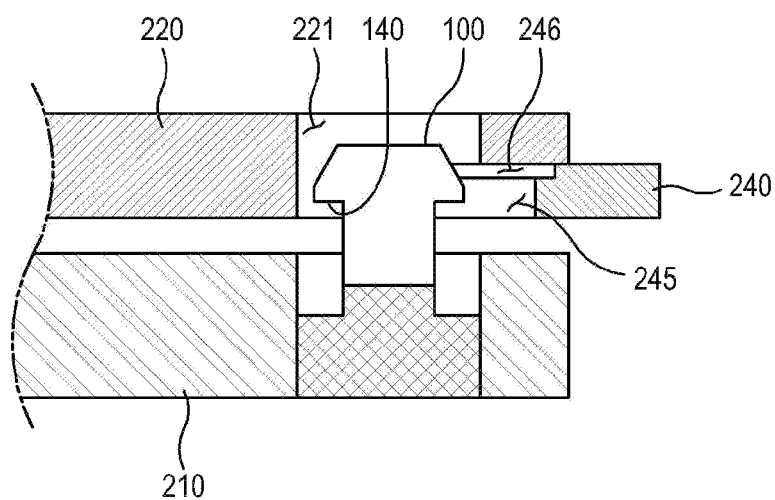

In FIG. 3, (a) is a lateral view of showing that the test socket 200 is put on the support locking pin 100. Referring to FIG. 4 and FIG. 7, the locking portion 241 of the locking member 240 is not aligned with the locking stopper 120 of the support locking pin 100 if the floating plate 220 is not pressed downward. In this state, the locking portion 241 cannot be locked to the locking stopper 120 since the opened width of the locking portion 241 is smaller than the width of the locking stopper 120. That is, the locking stopper 120 cannot be inserted in the locking portion 241.

In the first step, the floating plate 220 is pressed downward to move down. In FIG. 3, (b) is a lateral view of showing that the floating plate 220 is pressed downward and moved down. As he floating plate 220 moves down, the locking member 240 coupled to the floating plate 220 is also moved down. If the locking member 240 moves down, the locking portion 241 and the locking engaging portion 110 of the support locking pin 100 are aligned with each other, i.e. positioned to be lockable. At this time, the width of the locking engaging portion 110 is smaller than the width of the locking stopper 120 and is also equal to or a little smaller than the opened width of the locking portion 241.

Figure 5:
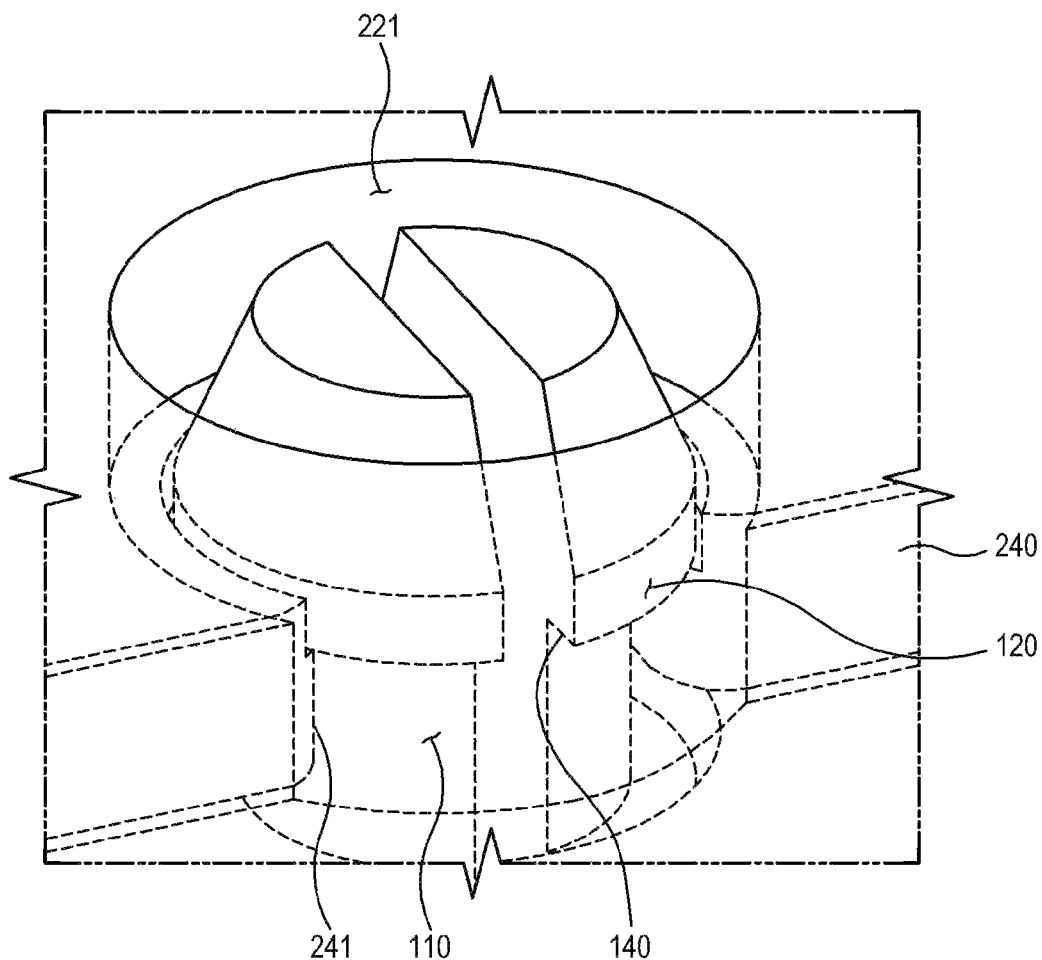
FIG. 5 is a partial perspective view of the test socket unit according to an exemplary embodiment after locking.

In the second step, the locking member 240 is inserted in the floating plate 220. In FIG. 3, (c) is a lateral view of showing that the locking members 240 are inserted in the floating plate 220. As shown in FIG. 5, if the locking member 240 moves inwards, the locking portion 241 is engaged with the locking engaging portion 110.

In the third step, the floating plate 220 is released from the downward pressure. If the floating plate 220 is released from the downward pressure, the floating plate 220 is urged to move upward by the elasticity of the elastic member 230. This movement makes the separation preventing portion 243 of the locking member 240 is caught in the holding projection 140 the support locking pin 100. Since the holding projection 140 holds the separation preventing portion 243, the upward movement of the floating plate 220 is restricted while the substrate 100 is urged upward by the elasticity of the elastic member 230. Therefore, the substrate 10 comes into closer contact with the bottom of the socket main body 210, thereby improving electric connection between the test socket 200 and the substrate 10.

The unlocking operations between the test socket 200 and the support locking pin 100 are carried out in reverse order to the foregoing locking operations. First, the floating plate 220 is pressed downward. In the state that the floating plate 220 is pressed downward, the locking member 240 is pulled out of the floating plate 220 so that the locking portion 241 and the locking engaging portion 110 can be separated from each other. If the floating plate 220 is released from the downward pressure after the locking portion 241 and the locking engaging portion 110 are separated, the test socket 200 is unlocked from the substrate 10.

Figure 6:
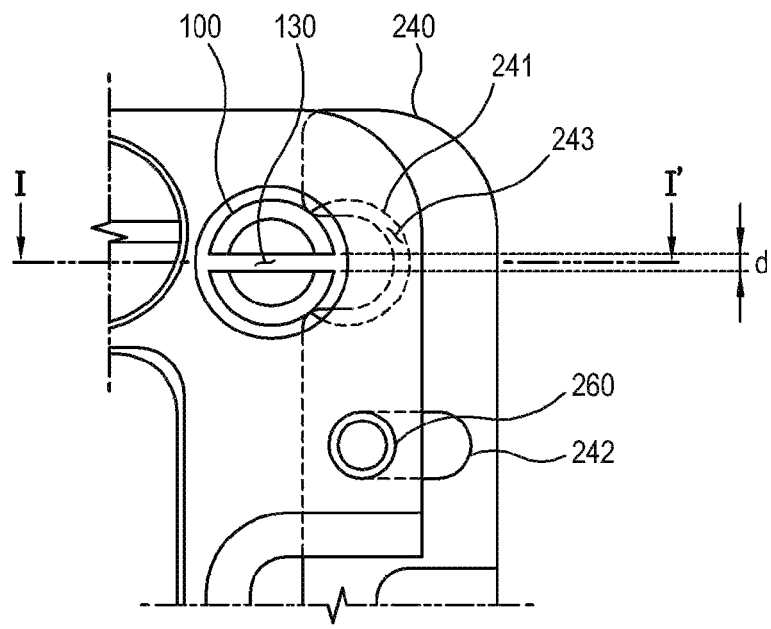
FIGS. 6 and 7 are partial plan and cross-sectional views of the test socket unit according to an exemplary embodiment before locking.
Figure 8:
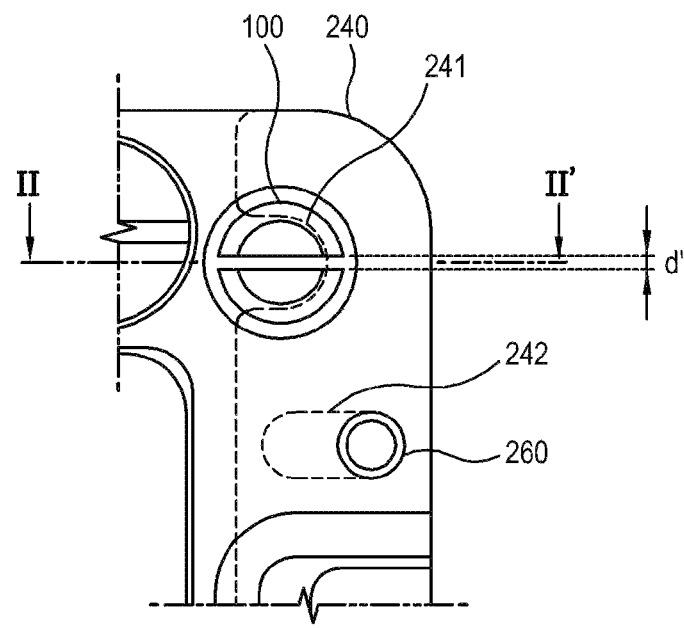
FIGS. 8 and 9 are partial plan and cross-sectional views of the test socket unit according to an exemplary embodiment after locking.
Figure 9:
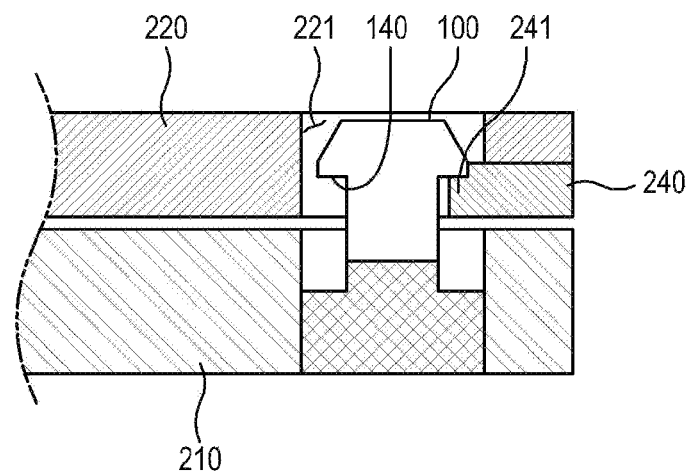

Referring to FIGS. 6 and 8, the width d of the groove 130 of the support locking pin 100 before locking is smaller than the width d' of the groove 130 of the support locking pin 100 after locking.

The support locking pin 100 is elastically transformable in the direction transverse to the protruding direction since it is branched into two by the groove 130. In the test socket unit 1 according to an exemplary embodiment, the circumference of the locking engaging portion 110 may be smaller than the circumference of the locking portion 241 having a partially opened semicircular shape. Therefore, the width of the groove 130 of the support locking pin 100 after locking the locking member 240 to the support locking pin 100 becomes narrower than that of the groove 130 before locking. The narrowed groove 130 gives outward elasticity to the engaging surface 245 and the stop surface 247 of the locking portion 241. Therefore, the support locking pin 100 and the locking member 240 can be locked more strongly, and thus horizontal alignment between the test socket 200 and the substrate 10 is more accurately maintained.

In the foregoing test socket unit 1 according to an exemplary embodiment, the test socket 200 is easily locked to and unlocked from the substrate 10 of the test circuit device, and it is thus possible to improve convenience in using the test socket unit 1. In addition, the test socket 200 and the substrate 10 are in stronger close-contact with each other by the elasticity, and it is thus possible to improve electric connection between the test socket 200 and the substrate 10.

In the foregoing exemplary embodiments, the support locking pin 100 and the locking member 240 shaped like a plate to be engaged with the support locking pin 100 are described in order to lock the test socket 200 to the substrate 10, but not limited thereto. Alternatively, the locking member may be shaped like a pin which is inserted through the top end of the support locking pin 100 and supported to the top surface of the floating plate 220.

In the foregoing exemplary embodiment, the guide pin 260 passes through the sliding slot 242 formed in the locking member 240 and supports the locking member 240 from the bottom of the locking member 240, but not limited thereto. Alternatively, the guide pin 260 may be inserted into a sliding slot formed in the floating plate 220, and coupled to the locking member 240 from the top surface of the floating plate 220.

According to an exemplary embodiment, the test socket can be easily locked to and unlocked from the substrate of the test circuit device.

Although a few exemplary embodiments have been shown and described, it will be appreciated by those skilled in the art that changes may be made in these exemplary embodiments without departing from the principles and spirit of the invention.

What is claimed is:

1. A test socket unit for testing electrical properties of a test circuit device, the test socket unit configured to be locked to a test substrate of the test circuit device for testing, the test socket unit comprising:
   - a plurality of support locking pins configured to be stationarily installed on the surface of the test substrate, each said support locking pin protruding upward from the surface of the test substrate and comprising a locking engaging portion and a locking stopper at an end portion along a protruding direction;
   - a socket main body configured to support a plurality of probes for signal transmission and comprising a plurality of pin through holes through which the support locking pins are inserted;
   - a floating plate comprising a plurality of pin guide holes to which the support locking pins are inserted, the floating plate coupled to a top surface of the socket main body while being vertically floated to a predetermined height from the socket main body;
   - at least one elastic member interposed in between the socket main body and the floating plate; and
   - at least one locking member placed adjacent to the floating plate, the locking member comprising a locking portion of semicircular or grooved shape configured to be selectively engaged with the locking engaging portion and prevented from separating upward by the locking stopper when the locking portion is coupled to the floating plate, and be movable so that the locking portion is to be selectively locked to and unlocked from the locking engaging portion in a state that the floating plate is elastically pressed against the socket main body.

2. The test socket unit according to claim 1, wherein the locking stopper comprises a holding projection more extended in a direction transverse to the protruding direction than the locking engaging portion, the locking member is supported on the floating plate and slides along a surface of the floating plate, and the locking portion is locked to and unlocked from the locking engaging portion along the surface of the floating plate.

3. The test socket unit according to claim 1, wherein the support locking pin comprises a groove formed in the protruding direction and is elastically transformable in a direction transverse to the protruding direction while being locked to and unlocked from the locking portion.

4. The test socket unit according to claim 1, wherein the at least one locking member comprises a pair of locking members arranged to face each other at opposite sides of the floating plate.

5. The test socket unit according to claim 1, wherein the locking member and the floating plate are engaged with each other to allow the locking member to slide.

6. The test socket unit according to claim 5, any one of the locking member and the floating plate has a sliding slot, and other one of the locking member and the floating plate has a guide pin inserted into the sliding slot.

* * * * *